United States Patent
Yu et al.

(10) Patent No.: US 7,814,389 B2
(45) Date of Patent: Oct. 12, 2010

(54) SYSTEM FOR PROCESSING AND TRANSMITTING DIGITAL BROADCASTING SIGNAL AND METHOD THEREOF

(75) Inventors: Jung-pil Yu, Suwon-si (KR); Hae-joo Jeong, Seoul (KR); Eui-jun Park, Seoul (KR); Joon-soo Kim, Seoul (KR); Yong-sik Kwon, Seoul (KR); Jin-Hee Jeong, Anyang-si (KR); Yong-deok Chang, Suwon-si (KR); Kum-ran Ji, Seoul (KR); Jong-hun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1062 days.

(21) Appl. No.: 11/504,651

(22) Filed: Aug. 16, 2006

(65) Prior Publication Data

US 2007/0092030 A1    Apr. 26, 2007

Related U.S. Application Data

(60) Provisional application No. 60/728,777, filed on Oct. 21, 2005, provisional application No. 60/734,295, filed on Nov. 8, 2005, provisional application No. 60/738,050, filed on Nov. 21, 2005, provisional application No. 60/739,448, filed on Nov. 25, 2005, provisional application No. 60/788,707, filed on Apr. 4, 2006.

(30) Foreign Application Priority Data

Jul. 20, 2006    (KR)    .................. 10-2006-0068037

(51) Int. Cl.
*H03M 13/00*    (2006.01)
(52) U.S. Cl. .................. 714/755; 375/265; 375/295; 714/786; 714/788; 714/762; 714/784
(58) Field of Classification Search .............. 714/755, 714/786, 784, 792, 762, 788; 375/265, 295
See application file for complete search history.

(56) References Cited

U.S. PATENT DOCUMENTS 6,373,831 B1    4/2002    Secord et al.

(Continued)

OTHER PUBLICATIONS

International Search Report mailed on Feb. 5, 2007, in International Application No. PCT/KR2006/004299.

(Continued)

*Primary Examiner*—Guy J Lamarre
(74) *Attorney, Agent, or Firm*—Sughrue Mion, PLLC

(57) ABSTRACT

A system for transmitting a digital broadcasting signal includes a Reed-Solomon encoder that encodes a dual transport stream including a normal stream and a turbo stream to obtain an encoded dual transport stream; an interleaver that interleaves the encoded dual transport stream to obtain an interleaved dual transport stream; and a turbo processor that detects the turbo stream from the interleaved dual transport stream to obtain a detected turbo stream, encodes the detected turbo stream to obtain an encoded turbo stream, stuffs the encoded turbo stream back into the interleaved dual transport stream to obtain a reconstructed dual transport stream, and compensates the reconstructed dual transport stream for a parity error due to the encoded turbo stream to obtain a parity-compensated dual transport stream.

25 Claims, 9 Drawing Sheets

U.S. PATENT DOCUMENTS

| | | | |
|---|---|---|---|
| 6,665,829 B2 | 12/2003 | Eroz et al. | |
| 6,910,170 B2 | 6/2005 | Choi et al. | |
| 2007/0091916 A1* | 4/2007 | Yu et al. | 370/464 |
| 2007/0091930 A1* | 4/2007 | Yu et al. | 370/474 |
| 2007/0092031 A1* | 4/2007 | Yu et al. | 375/295 |
| 2007/0092032 A1* | 4/2007 | Yu et al. | 375/295 |

OTHER PUBLICATIONS

Written Opinion of the International Searching Authority mailed on Feb. 5, 2007, in International Application No. PCT/KR2006/004299.

U.S. Appl. No. 11/416,254, filed May 3, 2006, Jung-pil Yu et al., Samsung Electronics Co., Ltd.

U.S. Appl. No. 11/416,258, filed May 3, 2006, Yong-sik Kwon et al., Samsung Electronics Co., Ltd.

U.S. Appl. No. 11/416,457, filed May 3, 2006, Jung-pil Yu et al., Samsung Electronics Co., Ltd.

U.S. Appl. No. 11/503,970, filed Aug. 15, 2006, Jung-pil Yu et al., Samsung Electronics Co., Ltd.

U.S. Appl. No. 11/504,024, filed Aug. 15, 2006, Jung-pil Yu et al., Samsung Electronics Co., Ltd.

U.S. Appl. No. 11/504,027, filed Aug. 15, 2006, Jung-pil Yu et al., Samsung Electronics Co., Ltd.

U.S. Appl. No. 11/504,029, filed Aug. 15, 2006, Jung-pil Yu et al., Samsung Electronics Co., Ltd.

U.S. Appl. No. 11/504,030, filed Aug. 15, 2006, Jung-pil Yu et al., Samsung Electronics Co., Ltd.

U.S. Appl. No. 11/504,031, filed Aug. 15, 2006, Jung-pil Yu et al., Samsung Electronics Co., Ltd.

U.S. Appl. No. 11/504,038, filed Aug. 15, 2006, Jung-pil Yu et al., Samsung Electronics Co., Ltd.

U.S. Appl. No. 11/504,724, filed Aug. 16, 2006, Jung-pil Yu et al., Samsung Electronics Co., Ltd.

U.S. Appl. No. 11/504,725, filed Aug. 16, 2006, Jung-pil Yu et al., Samsung Electronics Co., Ltd.

U.S. Appl. No. 11/504,726, filed Aug. 16, 2006, Jung-pil Yu et al., Samsung Electronics Co., Ltd.

U.S. Appl. No. 11/505,369, filed Aug. 17, 2006, Jung-pil Yu et al., Samsung Electronics Co., Ltd.

U.S. Appl. No. 11/505,894, filed Aug. 18, 2006, Eui-jun Park et al., Samsung Electronics Co., Ltd.

U.S. Appl. No. 11/508,144, filed Aug. 23, 2006, Jung-pil Yu et al., Samsung Electronics Co., Ltd.

U.S. Appl. No. 11/523,716, filed Sep. 20, 2006, Jung-pil Yu et al., Samsung Electronics Co., Ltd.

U.S. Appl. No. 11/692,509, filed Mar. 28, 2007, Hae-joo Jeong et al., Samsung Electronics Co., Ltd.

* cited by examiner

| SYNC | PID | Turbo Data |
|------|-----|------------|
| SYNC | PID | Normal Data |
| SYNC | PID | Normal Data |
| SYNC | PID | Normal Data |

1　　　3　　　　　　　184

SYSTEM FOR PROCESSING AND TRANSMITTING DIGITAL BROADCASTING SIGNAL AND METHOD THEREOF

CROSS-REFERENCE TO RELATED APPLICATIONS

This application claims the benefit of U.S. Provisional Patent Applications No. 60/728,777 filed on Oct. 21, 2005, No. 60/734,295 filed on Nov. 8, 2005, No. 60/738,050 filed on Nov. 21, 2005, No. 60/739,448 filed on Nov. 25, 2005, and No. 60/788,707 filed on Apr. 4, 2006, in the United States Patent and Trademark Office, and Korean Patent Application No. 2006-68037 filed on Jul. 20, 2006, in the Korean Intellectual Property Office. The disclosures of these six priority applications are incorporated herein by reference in their entirety.

BACKGROUND OF THE INVENTION

1. Field of the Invention

An aspect of the invention relates to a system for processing and transmitting a digital broadcasting signal and a method thereof that robustly processes and transmits a digital broadcasting transport stream, and more particularly to a system for processing and transmitting a digital broadcasting signal and a method thereof that robustly processes and transmits a digital broadcasting transport stream using a system having a simple construction that performs a robust data process on a robust stream in a dual transport stream including a normal stream and the robust stream to improve the reception performance of an Advanced Television Systems Committee Vestigial Sideband (VSB) Digital Television (DTV) system that is an American-type digital terrestrial broadcasting system.

2. Description of the Related Art

The ATSC VSB DTV system that is an American-type digital terrestrial broadcasting system is a single-carrier system that provides one field sync signal for each unit of 312 data segments. Accordingly, this system exhibits poor performance over an inferior channel, particularly over a Doppler fading channel.

FIG. 1 is a block diagram of an example of a digital broadcast transmitter and a digital broadcast receiver of an American-type digital terrestrial broadcasting system complying with an ATSC Enhanced VSB (EVSB) DTV system that has been proposed by Philips Electronics. The current version of this standard is ATSC Digital Television Standard A/53, Revision E, dated Dec. 27, 2005, with Amendment No. 1, dated Apr. 18, 2006, and can be downloaded from www.atsc.org. This standard is referred to hereafter as ATSC Standard A/53E. The contents of this standard are incorporated herein by reference in their entirety. This system generates and transmits a dual transport stream by adding a robust stream to a normal stream of the conventional ATSC VSB DTV system. A robust stream is a stream that has been subjected to a robust data process to provide improved reception performance compared to a normal stream over an inferior channel, particularly over a Doppler fading channel.

As shown in FIG. 1, the digital broadcast transmitter includes a randomizer 11 randomizing a dual transport stream, a Reed-Solomon (RS) encoder 12 in the form of a concatenated encoder adding parity bytes to the dual transport stream to correct errors occurring due to channel characteristics during transmission, an interleaver 13 interleaving the RS-encoded data according to a specified interleaving pattern, and a 2/3-rate trellis encoder 14 mapping the interleaved data into 8-level data symbols by performing a 2/3-rate trellis encoding of the interleaved data. The dual transport stream received by the randomizer 11 is an MPEG-2 dual transport stream, and thus the digital broadcast transmitter of FIG. 1 digital broadcast transmitter of FIG. 1 performs an error correction encoding of the MPEG-2 dual transport stream. The digital broadcast transmitter of FIG. 1 is an 8-VSB system because the trellis encoder 14 maps the interleaved data into 8-level data symbols.

The digital broadcast transmitter further includes a multiplexer (MUX) 15 multiplexing a field sync signal and a segment sync signal with the data symbols from the trellis encoder 14 to obtain an ATSC VSB DTV data frame having the configuration shown in FIG. 2, and a VSB modulator 16 inserting a pilot into the data symbols that have been multiplexed with the field sync signal and the segment sync signal by adding a specified DC value to the data symbols, performing a VSB modulation of the data symbols by pulse-shaping the data symbols to obtain a VSB-modulated signal, and up-converting the VSB-modulated signal to an RF channel band signal which is then transmitted over a channel.

Accordingly, in the digital broadcast transmitter of FIG. 1, a multiplexer (not shown) multiplexes the normal stream and the robust stream to obtain a dual transport stream that transmits the normal stream and the robust stream over one channel, and inputs the dual transport stream to the randomizer 11. The input data is randomized by the randomizer 11, the randomized data is outer-encoded by the RS encoder 12 serving as an outer encoder, and the outer-encoded data is interleaved by the interleaver 13 according to a specified interleaving pattern. The interleaved data is inner-encoded in units of 12 symbols and mapped into 8-level data symbols by the trellis encoder 14. A field sync signal and a segment sync signal are multiplexed with the data symbols from the trellis encoder 14 by the multiplexer 15. A pilot is inserted into the data symbols that have been multiplexed with the field sync signal and the segment sync signal by the VSB modulator 16, the data symbols with the inserted pilot are VSB-modulated and up-converted to the RF channel band signal by the VSB modulator 16, and the RF channel band signal is transmitted.

The digital broadcast receiver of FIG. 1 includes a tuner (not shown) down-converting the RF channel band signal received through the channel to a baseband signal, a VSB demodulator 21 performing sync detection and demodulation on the baseband signal, an equalizer 22 compensating the demodulated signal for channel distortions such as multipath, a Viterbi decoder 23 correcting errors in the equalized signal to obtain data symbols and decoding the data symbols to obtain decoded data, a deinterleaver 24 deinterleaving the decoded data according to the specified interleaving pattern used by the interleaver 13 of the digital broadcast transmitter, an RS decoder 25 correcting errors in the deinterleaved data, and a derandomizer 26 derandomizing the error-corrected data from the RS decoder 25 and outputting an MPEG-2 dual transport stream.

Accordingly, the digital broadcast receiver of FIG. 1 recovers the original signal inputted to the randomizer 11 of the digital broadcast transmitter of FIG. 1 by reversing the operations performed by the digital broadcast transmitter of FIG. 1 by down-converting the RF channel band signal to the baseband signal, demodulating and equalizing the baseband signal, and performing a channel decoding operation on the baseband signal.

FIG. 2 shows an ATSC VSB DTV data frame having the field sync signal and the segment sync signal that is used in the American-type digital terrestrial broadcasting system. As shown in FIG. 2, one frame consists of two fields, and one field consists of one field sync segment as the first segment, and 312 data segments. In the ATSC VSB DTV data frame, one data segment corresponds to one MPEG-2 packet, and consists of a 4-symbol segment sync signal and 828 data symbols.

The field sync signal and the segment sync signal shown in FIG. 2 are used for synchronization and equalization in the VSB demodulator 21 and the equalizer 22 in the digital broadcast receiver of FIG. 1. That is, the field sync signal and the segment sync signal are known data known to both the digital broadcast transmitter and the digital broadcast receiver of FIG. 1 which is used as a reference signal for the equalization performed by the equalizer 22 in the digital broadcast receiver of FIG. 1.

As discussed above, the digital terrestrial broadcasting system of FIG. 1 generates and transmits a dual transport stream by multiplexing the robust stream with the normal stream of the conventional ATSC VSB DTV system so that the robust stream is transmitted together with the conventional normal stream.

However, the digital terrestrial broadcasting system of FIG. 1 cannot improve the poor reception performance of the conventional normal stream over a multipath channel even when the dual transport stream with the multiplexed robust stream is transmitted. That is, the reception performance of the conventional normal stream is not improved at all even when the dual transport stream is transmitted. In addition, the reception performance of the robust stream over the multipath channel does not show any great improvement.

SUMMARY OF THE INVENTION

An aspect of the invention has been developed to solve the above drawbacks and other problems associated with the conventional digital terrestrial broadcasting system. An aspect of the invention is to provide a system for processing and transmitting a digital broadcasting signal and a method thereof that robustly process and transmits a digital broadcasting transport stream using a system having a simple construction that performs a robust data process on a robust stream in a dual transport stream including a normal stream and the robust stream to improve the reception performance of an ATSC VSB DTV system that is an American-type digital terrestrial broadcasting system.

According to an aspect of the invention, a system for transmitting a digital broadcasting signal includes a Reed-Solomon encoder that encodes a dual transport stream including a normal stream and a turbo stream to obtain an encoded dual transport stream; an interleaver that interleaves the encoded dual transport stream to obtain an interleaved dual transport stream; and a turbo processor that detects the turbo stream from the interleaved dual transport stream to obtain a detected turbo stream, encodes the detected turbo stream to obtain an encoded turbo stream, stuffs the encoded turbo stream back into the interleaved dual transport stream to obtain a reconstructed dual transport stream, and compensates the reconstructed dual transport stream for a parity error due to the encoded turbo stream to obtain a parity-compensated dual transport stream.

According to an aspect of the invention, the system may further include a transport stream constructor that receives the normal stream and the turbo stream from a source, multiplexes the normal stream and the turbo stream to obtain the dual transport stream, and outputs the dual transport stream to the Reed-Solomon encoder.

According to an aspect of the invention, the system may further include a randomizer that receives the dual transport stream output from the transport stream constructor, randomizes the dual transport stream to obtain a randomized dual transport stream, and outputs the randomized dual transport stream to the Reed-Solomon encoder.

According to an aspect of the invention, the turbo processor may include a turbo stream detector that detects the turbo stream from the interleaved dual transport stream to obtain a detected turbo stream; an outer encoder that outer-encodes the detected turbo stream by inserting a parity for the detected turbo stream into a parity insertion region of the detected turbo stream to obtain an outer-encoded turbo stream; an outer interleaver that outer-interleaves the outer-encoded turbo stream to obtain an outer-interleaved turbo stream; a turbo stream stuffer that stuffs the outer-interleaved turbo stream back into the interleaved dual transport stream to obtain the reconstructed dual transport stream; and a parity compensator that generates a parity for the reconstructed dual transport stream, and adds the parity for the reconstructed dual transport stream to the reconstructed dual transport stream to obtain the parity-compensated dual transport stream.

According to an aspect of the invention, the turbo processor may further include a byte-to-symbol converter that receives the interleaved dual transport stream from the interleaver, converts the interleaved dual transport stream from bytes to symbols to obtain a symbol-based interleaved dual transport stream, and outputs the symbol-based interleaved dual transport stream to the turbo stream detector; and a symbol-to-byte converter that receives the parity-compensated dual transport stream from the parity compensator, converts the parity-compensated dual transport stream from symbols to bytes to obtain a byte-based parity-compensated dual transport stream, and outputs the byte-based parity-compensated dual transport stream.

According to an aspect of the invention, the system may further include a trellis encoder that trellis-encodes the parity-compensated dual transport stream to obtain a trellis-encoded dual transport stream.

According to an aspect of the invention, the system may further include a transmitter that transmits the trellis-encoded dual transport stream.

According to an aspect of the invention, the transmitter may include a multiplexer that multiplexes a sync signal with the trellis-encoded dual transport stream to obtain a trellis-encoded dual transport stream with sync; a pilot inserter that inserts a pilot into the trellis-encoded dual transport stream with sync to obtain a trellis-encoded dual transport stream with sync and pilot; a pre-equalizer that equalizes the trellis-encoded dual transport stream with sync and pilot to obtain an equalized dual transport stream; a vestigial sideband (VSB) modulator that performs a VSB modulation of the equalized dual transport stream to obtain a VSB-modulated dual transport stream; and a radio-frequency (RF) modulator that performs a VSB modulation of the VSB-modulated dual transport stream to obtain an RF channel band signal that transmits the VSB-modulated dual transport stream.

According to an aspect of the invention, the dual transport stream may include a plurality of fields each including a plurality of successive packets; and wherein the turbo stream is inserted in ones of the packets positioned at predetermined intervals in each of the fields.

According to an aspect of the invention, there is provided a method of processing a digital broadcasting signal including encoding a dual transport stream including a normal stream and a turbo stream to obtain an encoded dual transport stream; interleaving the encoded dual transport stream to obtain an interleaved dual transport stream; detecting the turbo stream from the interleaved dual transport stream to obtain a detected turbo stream; encoding the detected turbo stream to obtain an encoded turbo stream; stuffing the detected turbo stream back into the interleaved dual transport stream to obtain a reconstructed dual transport stream; and compensating the reconstructed dual transport stream for a parity error due to the encoded turbo stream to obtain a parity-compensated dual transport stream.

According to an aspect of the invention, the method may further include receiving the normal stream and the turbo stream from a source; and multiplexing the normal stream and the turbo stream to obtain the dual transport stream.

According to an aspect of the invention, the method may further include randomizing the dual transport stream to obtain a randomized dual transport stream; wherein the encoding of the dual transport stream includes encoding the randomized dual transport stream to obtain the encoded dual transport stream.

According to an aspect of the invention, the encoding of the detected turbo stream may include outer-encoding the detected turbo stream by inserting a parity for the detected turbo stream into a parity insertion region of the detected turbo stream to obtain an outer-encoded turbo stream, and outer-interleaving the outer-encoded turbo stream to obtain an outer-interleaved turbo stream; wherein the stuffing of the encoded turbo stream includes stuffing the outer-interleaved turbo stream back into the interleaved dual transport stream to obtain the reconstructed dual transport stream; and wherein the compensating of the reconstructed dual transport stream includes generating a parity for the reconstructed dual transport stream, and adding the parity for the reconstructed dual transport stream to the reconstructed dual transport stream to obtain the parity-compensated dual transport stream.

According to an aspect of the invention, the method may further include converting the interleaved dual transport stream from bytes to symbols to obtain a symbol-based interleaved dual transport stream; wherein the detecting of the turbo stream includes detecting the turbo stream from the symbol-based interleaved dual transport stream to obtain the detected turbo stream; and wherein the method further includes converting the parity-compensated dual transport stream from bytes to symbols to obtain a byte-based parity-compensated dual transport stream.

According to an aspect of the invention, the method may further include trellis-encoding the parity-compensated dual transport stream to obtain a trellis-encoded dual transport stream; and transmitting the trellis-encoded dual transport stream.

According to an aspect of the invention, the transmitting of the trellis-encoded dual transport stream may include multiplexing a sync signal with the trellis-encoded dual transport stream to obtain a trellis-encoded dual transport stream with sync; inserting a pilot into the trellis-encoded dual transport stream with sync to obtain a trellis-encoded dual transport stream with sync and pilot; equalizing the trellis-encoded dual transport stream with sync and pilot to obtain an equalized dual transport stream; performing a vestigial sideband (VSB) modulation of the equalized dual transport stream to obtain a VSB-modulated dual transport stream; and performing a radio-frequency (RF) modulation of the VSB-modulated dual transport stream to obtain an RF channel band signal that transmits the VSB-modulated dual transport stream.

According to an aspect of the invention, the dual transport stream may include a plurality of fields each including a plurality of successive packets; wherein the turbo stream is inserted in ones of the packets positioned at predetermined intervals in each of the fields.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of embodiments of the invention, taken in conjunction with the accompanying drawings of which.

DETAILED DESCRIPTION OF THE EMBODIMENTS

Figure 1:
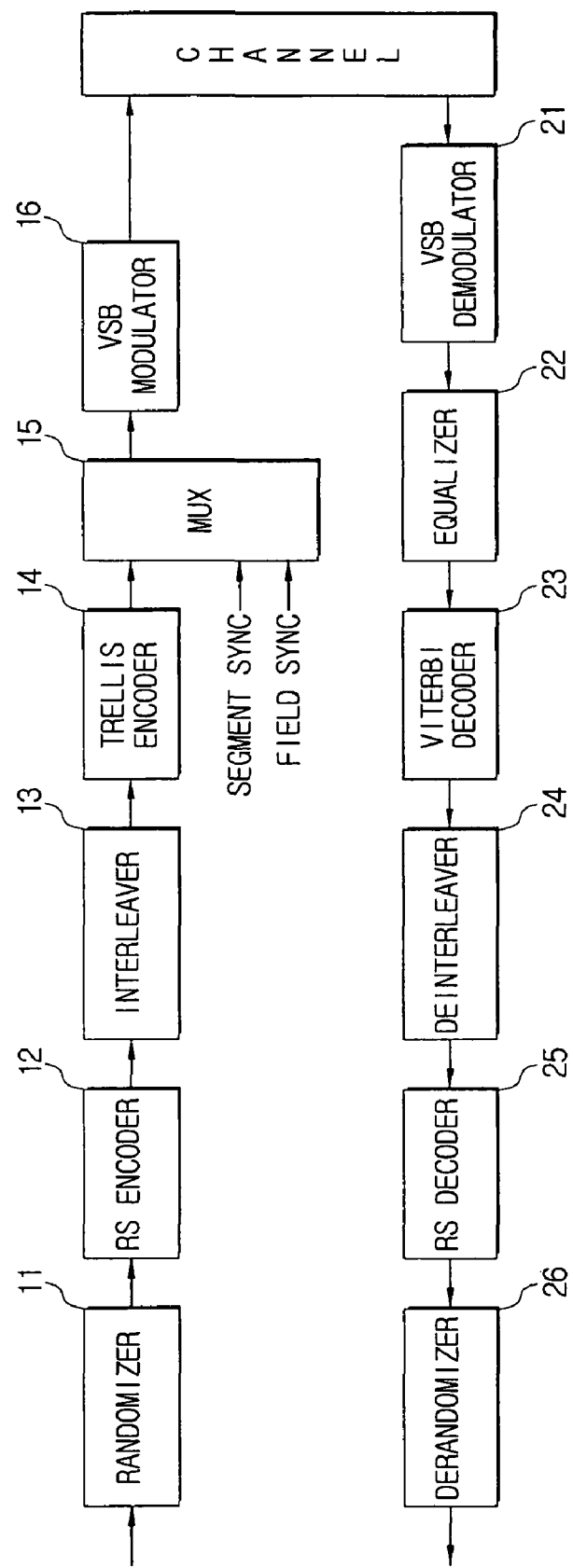
FIG. 1 is a block diagram of an example of a conventional ATSC VSB DTV digital broadcasting system including a digital broadcast transmitter and a digital broadcast receiver.
Figure 2:
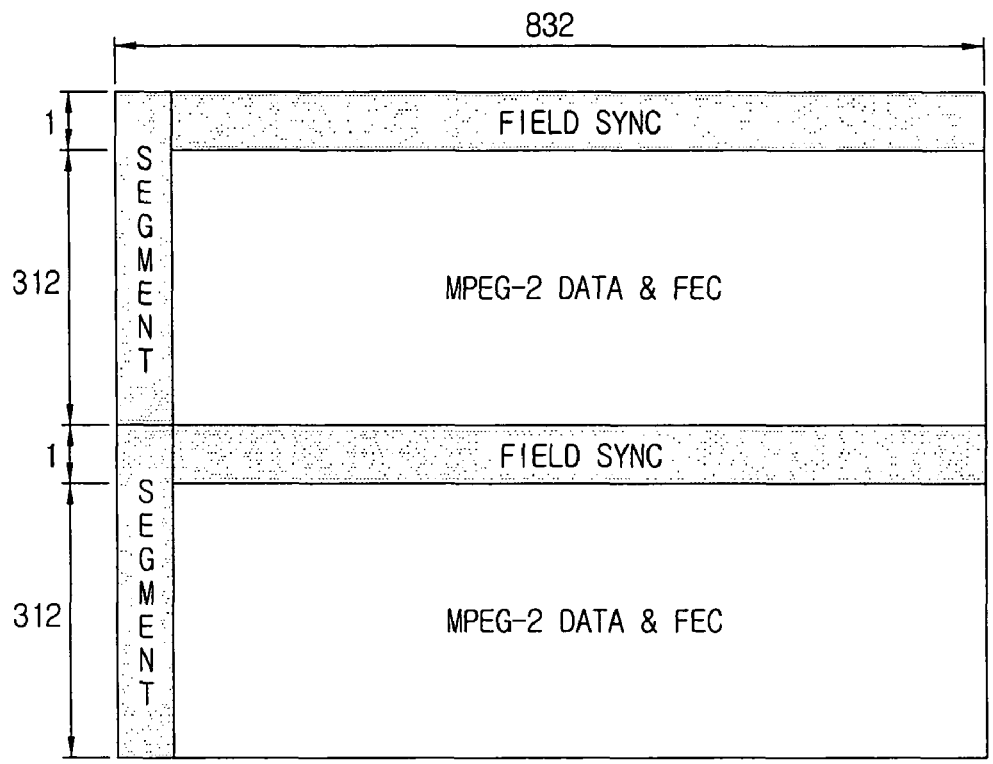
FIG. 2 is a diagram of a conventional ATSC VSB DTV data frame.

Reference will now be made in detail to embodiments of the invention, examples of which are shown in the accompanying drawings, wherein like reference numerals refer to like elements throughout. The specific configurations and elements in the following description are merely examples provided to assist in a comprehensive understanding of the invention. Thus, it is apparent that the invention can be carried out without these specific configurations and elements. Also, well-known functions and elements are not described in detail to avoid obscuring aspects of the invention with unnecessary details.

Figure 3:
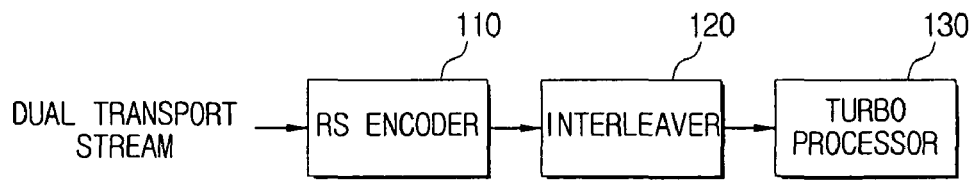
FIG. 3 is a block diagram of an example of a portion of a system for transmitting a digital broadcasting signal according to an aspect of the invention.

FIG. 3 is a block diagram of an example of a portion of a system for transmitting a digital broadcasting signal according to an aspect of the invention. Referring to FIG. 3, the system for transmitting a digital broadcasting signal includes a Reed-Solomon (RS) encoder 110, an interleaver 120, and a turbo processor 130.

The RS encoder 110 receives and encodes a dual transport stream in which a normal stream and a turbo stream are mixed.

The interleaver 120 interleaves the encoded dual transport stream.

The turbo processor 130 performs a turbo process for robustly processing the turbo stream included in the dual transport stream. The turbo process is a robust data process that makes the turbo stream more robust by detecting the turbo stream included in the interleaved dual transport stream, encoding the detected turbo stream using a convolutional encoding and an interleaving process, and stuffing the encoded turbo stream back into the dual transport stream. The turbo process provides improved reception performance for the turbo stream over an inferior channel, particularly over a Doppler fading channel, and enables the turbo stream of the dual transport stream to be transmitted without errors over an inferior channel over which the normal stream of the dual transport stream cannot be transmitted without errors. Through the turbo process, the dual transport stream that includes both the turbo stream and the normal stream can be generated. Since the turbo processor 130 performs a separate encoding of the turbo stream after the encoding performed by the RS encoder 110, a parity of the dual transport stream that was generated by the RS encoder 110 is changed when the encoded turbo stream is stuffed back into the dual transport stream, creating a parity error in the dual transport stream. Accordingly, the turbo processor 130 compensates for this parity error in the dual transport stream after the dual transport stream is stuffed with the encoded turbo stream. Specifically, the parity error is compensated for by generating and inserting the parity for the reconstructed dual transport stream.

Figure 4:
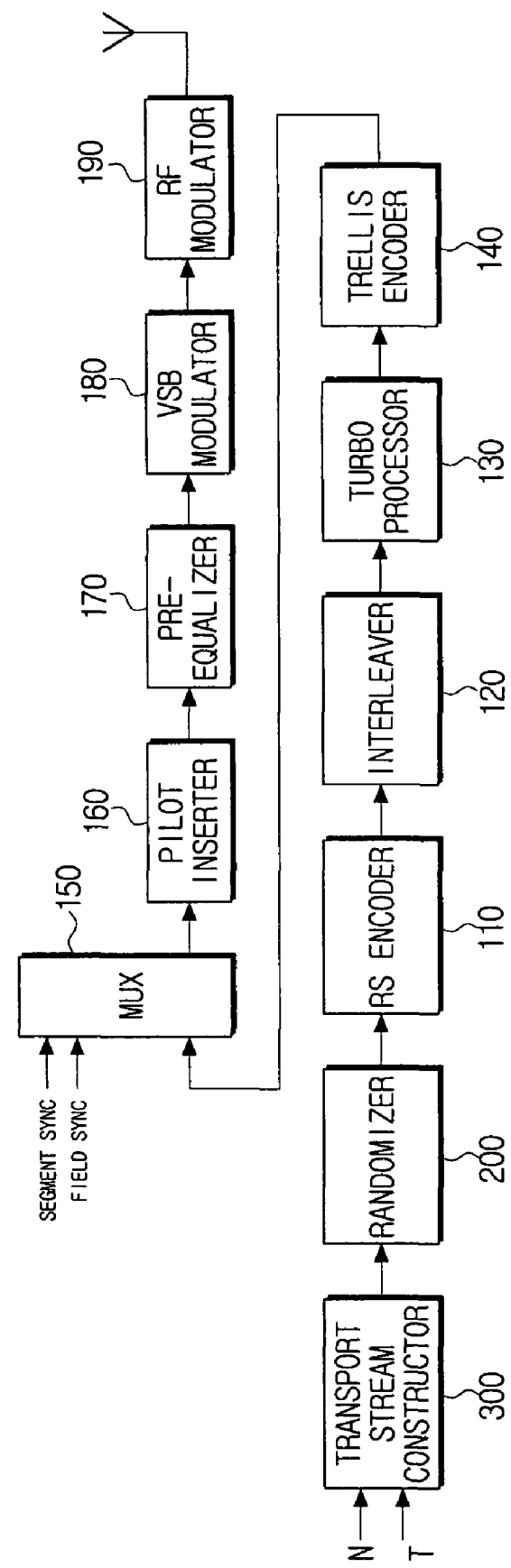
FIG. 4 is a block diagram a system for transmitting a digital broadcasting signal according to an aspect of the invention including the portion shown in FIG. 3.

FIG. 4 is a block diagram of an example of a system for transmitting a digital broadcasting signal according to an aspect of the invention including the portion shown in FIG. 3. Referring to FIG. 4, the system for transmitting a digital broadcasting signal according to an aspect of the invention may further include a trellis encoder 140, a multiplexer (MUX) 150, a pilot inserter 160, a pre-equalizer 170, a VSB modulator 180, an RF modulator, a randomizer 200, and a transport stream constructor 300, in addition to the RS encoder 110, the interleaver 120, and the turbo processor 130 shown in FIG. 3.

First, the transport stream constructor 300 generates the dual transport stream by receiving and multiplexing the normal stream and the turbo stream received from a source. The normal stream and the turbo stream can be received from an external module such as a broadcast imaging device, or an internal module such as a compression processing module (e.g., an MPEG-2 module), a video encoder, and an audio encoder. The transport stream constructor 300 will be explained below in greater detail.

The randomizer 200 randomizes the dual transport stream and provides the randomized dual transport stream to the RS encoder 110. The RS encoder 110 encodes the dual transport stream, and the interleaver 120 interleaves the encoded dual transport stream. The turbo processor 130 performs a turbo process on the interleaved dual transport stream, and compensates for the parity error due to the turbo process.

The trellis encoder 140 performs a trellis encoding of the dual transport stream turbo-processed by the turbo processor 130.

The multiplexer 150 multiplexes the trellis-encoded dual transport stream with a segment sync signal and a field sync signal.

The pilot inserter 160 inserts a pilot into the dual transport stream multiplexed with the sync signals by adding a specified DC value to the dual transport stream.

The pre-equalizer 170 equalizes the dual transport stream with the sync signals and the pilot to minimize intersymbol interference.

The VSB modulator 180 performs a VSB modulation of the equalized dual transport stream.

The RF modulator 190 modulates the VSB-modulated dual transport stream to obtain an RF channel band signal that transmits the VSB-modulated dual transport stream. In FIG. 4, the elements from the multiplexer 150 through the RF modulator 190 are constituent elements that participate in transmission of the dual transport stream, and are called a transmitter in the following description. One or more of the multiplexer 150 through the RF modulator 190 that constitute the transmitter may be omitted, or additional constituent elements required for the transmission may be added to the transmitter.

Figure 5:
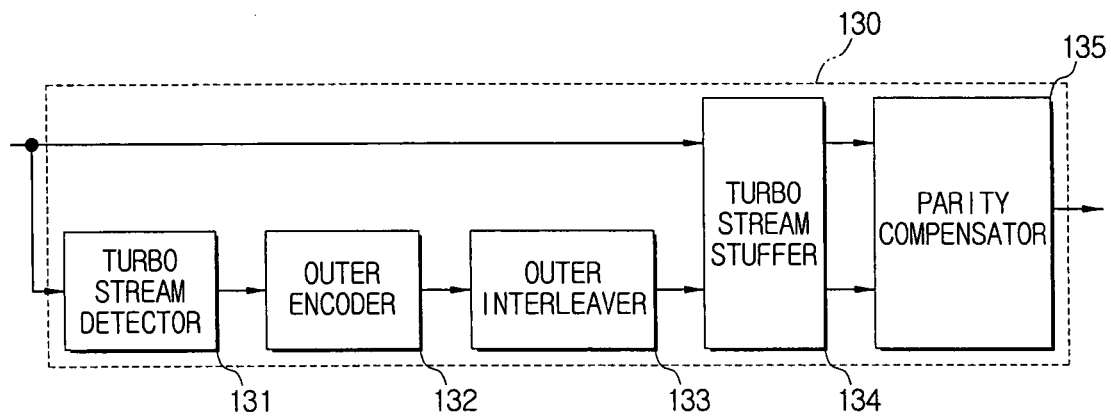
FIG. 5 is a block diagram of an example of the turbo processor 130 of FIGS. 3 and 4 according to an aspect of the invention.

FIG. 5 is a block diagram of an example of the turbo processor 130 of FIGS. 3 and 4 according to an aspect of the invention. Referring to FIG. 5, the turbo processor 130 includes a turbo stream detector 131, an outer encoder 132, an outer interleaver 133, a turbo stream stuffer 134, and a parity compensator 135.

The turbo stream detector 131 detects the turbo stream from the dual transport stream. The turbo stream detector 131 may be implemented by a demultiplexer or any other suitable device.

The outer encoder 132 encodes the turbo stream by adding a parity to a parity insertion region provided in the detected turbo stream.

The outer interleaver 133 interleaves the encoded turbo stream.

The turbo stream stuffer 134 reconstructs the dual transport stream by multiplexing the interleaved turbo stream and the normal stream. Specifically, the turbo stream stuffer 134 reconstructs the dual transport stream by stuffing the interleaved turbo stream back into the dual transport stream at the same position at which the turbo stream was detected by the turbo stream detector 131. The turbo stream stuffer 134 may be implemented by a multiplexer or any other suitable device.

The parity compensator 135 compensates for a parity error due to the turbo stream encoding by generating and adding the parity of the reconstructed dual transport stream to the reconstructed dual transport stream.

Figure 6:
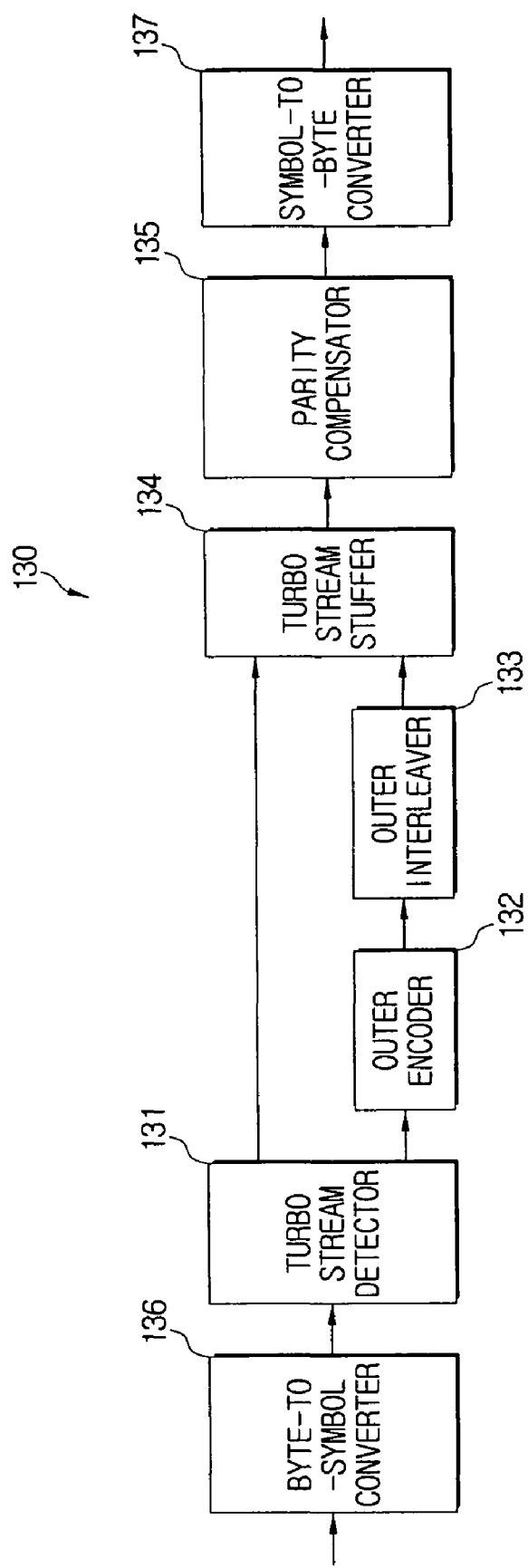
FIG. 6 is a block diagram of another example of the turbo processor 130 of FIGS. 3 and 4 according to an aspect of the invention.

FIG. 6 is a block diagram of another example of the turbo processor 130 of FIGS. 3 and 4 according to an aspect of the invention. Referring to FIG. 6, the turbo processor 130 further includes a byte-to-symbol converter 136 and a symbol-to-byte converter 137, in addition to the turbo stream detector 131, the outer encoder 132, the outer interleaver 133, the turbo stream stuffer 134, and the parity compensator 135.

The byte-to-symbol converter 136 converts the dual transport stream interleaved by the interleaver 120 from bytes to symbols using a 12-way symbol interleaving process in accordance with Table D5.2 in Section 5.4.1.4 of Annex D of ATSC Standard A/53E incorporated by reference above. This conversion will be easily understood by those skilled in the art, and thus will not be described in detail here. However, for the sake of convenience, Table D5.2 is reproduced below as the following Table 1:

TABLE 1

(Table D5.2 of ATSC Standard A/53E)

| Symbol | Segment 0 | | | Segment 1 | | | Segment 2 | | | Segment 3 | | | Segment 4 | | |
|---|---|---|---|---|---|---|---|---|---|---|---|---|---|---|---|
| | Trellis | Bytes | Bits | Trellis | Bytes | Bits | Trellis | Bytes | Bits | Trellis | Bytes | Bits | Trellis | Bytes | Bits |
| 0 | 0 | 0 | 7, 6 | 4 | 208 | 5, 4 | 8 | 412 | 3, 2 | 0 | 616 | 1, 0 | 4 | 828 | 7, 6 |
| 1 | 1 | 1 | 7, 6 | 5 | 209 | 5, 4 | 9 | 413 | 3, 2 | 1 | 617 | 1, 0 | 5 | 829 | 7, 6 |
| 2 | 2 | 2 | 7, 6 | 6 | 210 | 5, 4 | 10 | 414 | 3, 2 | 2 | 618 | 1, 0 | 6 | 830 | 7, 6 |
| 3 | 3 | 3 | 7, 6 | 7 | 211 | 5, 4 | 11 | 415 | 3, 2 | 3 | 619 | 1, 0 | ... | ... | ... |
| 4 | 4 | 4 | 7, 6 | 8 | 212 | 5, 4 | 0 | 416 | 3, 2 | 4 | 620 | 1, 0 | ... | ... | ... |
| 5 | 5 | 5 | 7, 6 | 9 | 213 | 5, 4 | 1 | 417 | 3, 2 | 5 | 621 | 1, 0 | ... | ... | ... |
| 6 | 6 | 6 | 7, 6 | 10 | 214 | 5, 4 | 2 | 418 | 3, 2 | 6 | 622 | 1, 0 | ... | ... | ... |
| 7 | 7 | 7 | 7, 6 | 11 | 215 | 5, 4 | 3 | 419 | 3, 2 | 7 | 623 | 1, 0 | ... | ... | ... |
| 8 | 8 | 8 | 7, 6 | 0 | 204 | 5, 4 | 4 | 408 | 3, 2 | 8 | 612 | 1, 0 | ... | ... | ... |
| 9 | 9 | 9 | 7, 6 | 1 | 205 | 5, 4 | 5 | 409 | 3, 2 | 9 | 613 | 1, 0 | ... | ... | ... |
| 10 | 10 | 10 | 7, 6 | 2 | 206 | 5, 4 | 6 | 410 | 3, 2 | 10 | 614 | 1, 0 | ... | ... | ... |
| 11 | 11 | 11 | 7, 6 | 3 | 207 | 5, 4 | 7 | 411 | 3, 2 | 11 | 615 | 1, 0 | ... | ... | ... |
| 12 | 0 | 0 | 5, 4 | 4 | 208 | 3, 2 | 8 | 412 | 1, 0 | 0 | 624 | 7, 6 | ... | ... | ... |
| 13 | 1 | 1 | 5, 4 | 5 | 209 | 3, 2 | 9 | 413 | 1, 0 | 1 | 625 | 7, 6 | ... | ... | ... |
| ... | ... | ... | ... | ... | ... | ... | ... | ... | ... | ... | ... | ... | ... | ... | ... |
| 19 | 7 | 7 | 5, 4 | 11 | 215 | 3, 2 | 3 | 419 | 1, 0 | 7 | 631 | 7, 6 | ... | ... | ... |
| 20 | 8 | 8 | 5, 4 | 0 | 204 | 3, 2 | 4 | 408 | 1, 0 | 8 | 632 | 7, 6 | ... | ... | ... |
| 21 | 9 | 9 | 5, 4 | 1 | 205 | 3, 2 | 5 | 409 | 1, 0 | 9 | 633 | 7, 6 | ... | ... | ... |
| 22 | 10 | 10 | 5, 4 | 2 | 206 | 3, 2 | 6 | 410 | 1, 0 | 10 | 634 | 7, 6 | ... | ... | ... |
| 23 | 11 | 11 | 5, 4 | 3 | 207 | 3, 2 | 7 | 411 | 1, 0 | 11 | 635 | 7, 6 | ... | ... | ... |
| 24 | 0 | 0 | 3, 2 | 4 | 208 | 1, 0 | 8 | 420 | 7, 6 | 0 | 624 | 5, 4 | ... | ... | ... |
| 25 | 1 | 1 | 3, 2 | 5 | 209 | 1, 0 | 9 | 421 | 7, 6 | 1 | 625 | 5, 4 | ... | ... | ... |
| ... | ... | ... | ... | ... | ... | ... | ... | ... | ... | ... | ... | ... | ... | ... | ... |
| 31 | 7 | 7 | 3, 2 | 11 | 215 | 1, 0 | 3 | 427 | 7, 6 | ... | ... | ... | ... | ... | ... |
| 32 | 8 | 8 | 3, 2 | 0 | 204 | 1, 0 | 4 | 428 | 7, 6 | ... | ... | ... | ... | ... | ... |
| 33 | 9 | 9 | 3, 2 | 1 | 205 | 1, 0 | 5 | 429 | 7, 6 | ... | ... | ... | ... | ... | ... |
| 34 | 10 | 10 | 3, 2 | 2 | 206 | 1, 0 | 6 | 430 | 7, 6 | ... | ... | ... | ... | ... | ... |
| 35 | 11 | 11 | 3, 2 | 3 | 207 | 1, 0 | 7 | 431 | 7, 6 | ... | ... | ... | ... | ... | ... |
| 36 | 0 | 0 | 1, 0 | 4 | 218 | 7, 6 | 8 | 420 | 5, 4 | ... | ... | ... | ... | ... | ... |
| 37 | 1 | 1 | 1, 0 | 5 | 219 | 7, 6 | 9 | 421 | 5, 4 | ... | ... | ... | ... | ... | ... |
| ... | ... | ... | ... | ... | ... | ... | ... | ... | ... | ... | ... | ... | ... | ... | ... |
| 47 | 11 | 11 | 1, 0 | 3 | 227 | 7, 6 | ... | ... | ... | ... | ... | ... | ... | ... | ... |
| 48 | 0 | 12 | 7, 6 | 4 | 216 | 5, 4 | ... | ... | ... | ... | ... | ... | ... | ... | ... |
| 49 | 1 | 13 | 7, 6 | 5 | 217 | 5, 4 | ... | ... | ... | ... | ... | ... | ... | ... | ... |
| ... | ... | ... | ... | ... | ... | ... | ... | ... | ... | ... | ... | ... | ... | ... | ... |
| 95 | 11 | 23 | 1, 0 | ... | ... | ... | ... | ... | ... | ... | ... | ... | ... | ... | ... |
| 96 | 0 | 24 | 7, 6 | ... | ... | ... | ... | ... | ... | ... | ... | ... | ... | ... | ... |
| 97 | 1 | 25 | 7, 6 | ... | ... | ... | ... | ... | ... | ... | ... | ... | ... | ... | ... |
| ... | ... | ... | ... | ... | ... | ... | ... | ... | ... | ... | ... | ... | ... | ... | ... |
| 767 | 11 | 191 | 1, 0 | ... | ... | ... | ... | ... | ... | ... | ... | ... | ... | ... | ... |
| 768 | 0 | 192 | 7, 6 | ... | ... | ... | ... | ... | ... | ... | ... | ... | ... | ... | ... |
| 769 | 1 | 193 | 7, 6 | ... | ... | ... | ... | ... | ... | ... | ... | ... | ... | ... | ... |
| ... | ... | ... | ... | ... | ... | ... | ... | ... | ... | ... | ... | ... | ... | ... | ... |
| 815 | 11 | 203 | 1, 0 | 3 | 419 | 7, 6 | 7 | 623 | 5, 4 | 11 | 827 | 3, 2 | ... | ... | ... |
| 816 | 0 | 204 | 7, 6 | 4 | 408 | 5, 4 | 8 | 612 | 3, 2 | 0 | 816 | 1, 0 | ... | ... | ... |
| 817 | 1 | 205 | 7, 6 | 5 | 409 | 5, 4 | 9 | 613 | 3, 2 | 1 | 817 | 1, 0 | ... | ... | ... |
| ... | ... | ... | ... | ... | ... | ... | ... | ... | ... | ... | ... | ... | ... | ... | ... |
| 827 | 11 | 215 | 7, 6 | 3 | 419 | 5, 4 | 7 | 623 | 3, 2 | 11 | 827 | 10 | ... | ... | ... |

The turbo stream detector 131 detects the turbo stream from the dual transport stream converted into symbols. The turbo stream detector 131 may be implemented by a demultiplexer or any other suitable device.

The outer encoder 132 encodes the turbo stream by generating and inserting the parity for the detected turbo stream into a parity insertion region provided in the detected turbo stream. The outer encoder 132 encodes the turbo stream in byte units.

The outer interleaver 133 interleaves the encoded turbo stream in bit units.

The turbo stream stuffer 134 reconstructs the dual transport stream by multiplexing the interleaved turbo stream and the normal stream. Specifically, the turbo stream stuffer 134 reconstructs the dual transport stream by stuffing the interleaved turbo stream back into the dual transport stream at the same position at which the turbo stream was detected by the turbo stream detector 131. The turbo stream stuffer 134 may be implemented by a multiplexer or any other suitable device.

The symbol-to-byte converter 137 converts the unit of the dual transport stream from symbols to bytes using a 12-way symbol deinterleaving process that is the reverse of the 12-way symbol interleaving process performed by the byte-to-symbol converter 136 in accordance with Table D5.2 of ATSC Standard A/53E as described above. This conversion will be easily understood by those skilled in the art, and thus will not be described in detail here.

Figures 7, 8:
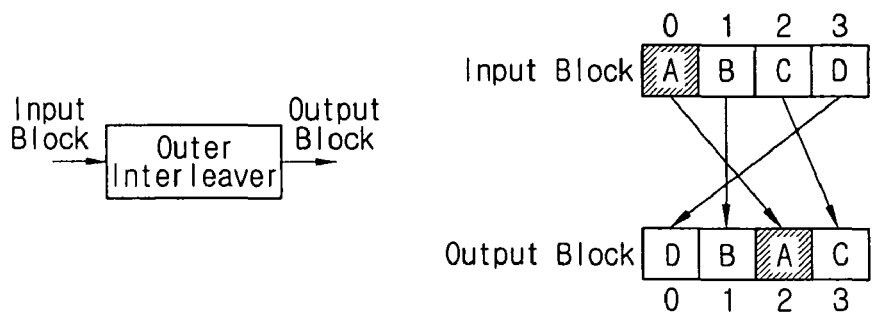
FIG. 7 is a diagram for explaining an example of an interleaving process performed by the outer interleaver 133 of FIGS. 5 and 6 according to an aspect of the invention.
FIG. 8 is a diagram of an example of a dual transport stream transmitted by a system for transmitting a digital broadcasting signal according to an aspect of the invention.

FIG. 7 is a diagram for explaining an interleaving process performed by the outer interleaver 133 of FIGS. 5 and 6 according to an aspect of the invention. Referring to FIG. 7, the outer interleaver 133 interleaves the bits of the encoded turbo stream output from the outer encoder 132 according to a specified interleaving rule. For example, if the interleaving rule is {2, 1, 3, 0} and bits ABCD of the encoded turbo stream are successively inputted to the outer interleaver 133, the outer interleaver 133 interleaves these bits ABCD and outputs them in the order DBAC as shown in FIG. 7 as an interleaved turbo stream. However, the invention is not limited to the interleaving rule of {2, 1, 3, 0} which is merely one example of an interleaving rule, and any suitable interleaving rule may be used.

FIG. 8 is a diagram of an example of a dual transport stream transmitted by a system for transmitting a digital broadcasting signal according to an aspect of the invention. Referring to FIG. 8, the dual transport stream is composed of plural successive packets. One packet may be composed of 188 bytes. Specifically, one packet is composed of a sync signal of one byte, a PID (Packet Identity) of three bytes, and data of 184 bytes. Referring to FIG. 8, the robust stream, i.e., the turbo stream, is arranged only in specified packets of the dual transport stream. Specifically, 78 packets of the turbo stream are inserted into 312 packets of one field of the dual transport stream. Accordingly, in the dual transport stream, packets of the turbo stream and the normal stream are repeatedly arranged in groups of four packets in the ratio of 1:3. That is, one packet (188 bytes) of the turbo stream and three packets (3×188 bytes) of the normal stream are successively arranged. The structure of the dual transport stream may be changed according to various aspects of the invention. For example, the turbo stream packet may be provided in the 2nd, 6th, 10th, etc., packets in a field or in packets at any other suitable positions, rather than in the 1st, 5th, 9th, etc, packets in a field as shown in FIG. 8. Also, the turbo stream packet may be provided twice every four packets, three times every four packets, or four times every four packets (i.e., in every packet).

Figure 9:
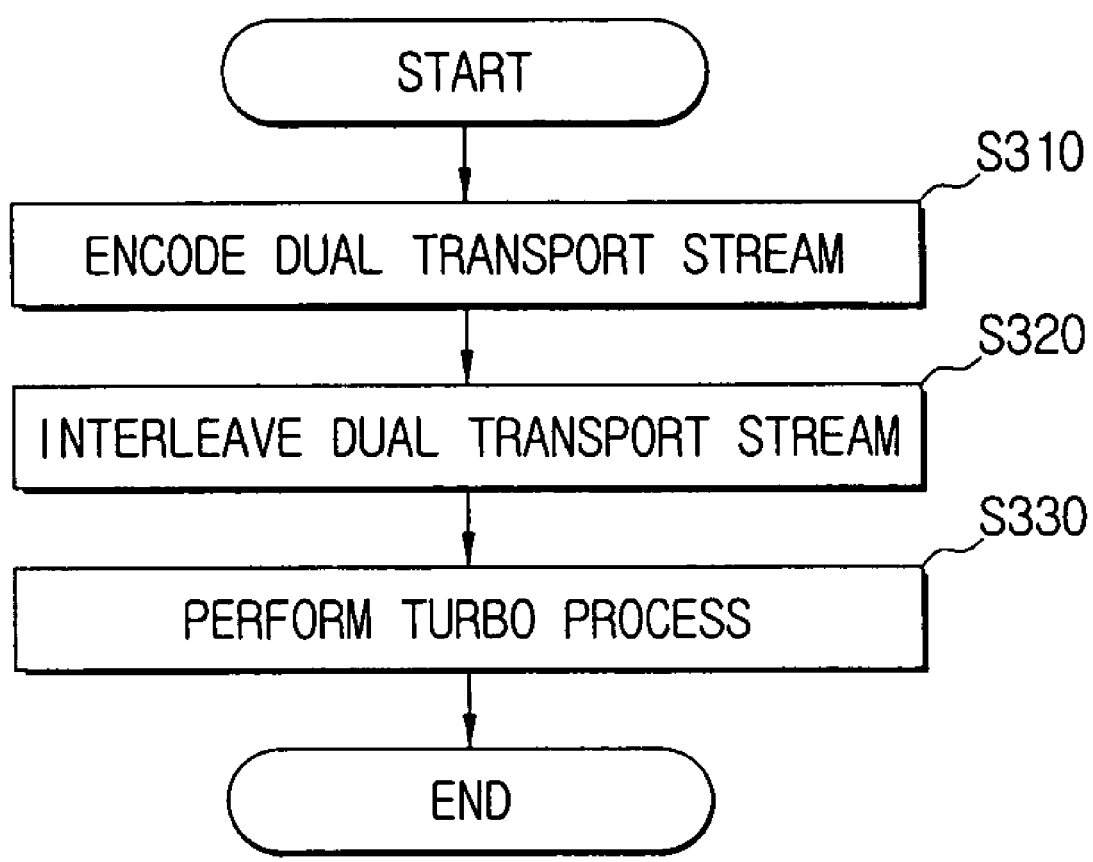
FIG. 9 is a flowchart of an example of a portion of a method of processing a digital broadcasting signal according to an aspect of the invention.

FIG. 9 is a flowchart of an example of a portion of a method of processing a digital broadcasting signal according to an aspect of the invention.

Referring to FIG. 9, the dual transport stream, in which the normal stream and the turbo stream are multiplexed, is received and encoded (block S310).

Then, the encoded dual transport stream is interleaved (block S320), and then turbo-processed (block S330). The turbo process is a process that makes the turbo stream robust by detecting the turbo stream included in the interleaved dual transport stream and encoding the detected turbo stream using a convolutional encoding and an interleaving process, and stuffing the encoded turbo stream back into the dual transport stream. This turbo process provides improved reception performance for the turbo stream over an inferior channel, particularly over a Doppler fading channel, and enables the turbo stream of the dual transport stream to be transmitted without errors over an inferior channel over which the normal stream of the dual transport stream cannot be transmitted without errors. Through this turbo process, the dual transport stream that includes both the turbo stream and the normal stream can be generated.

Figure 10:
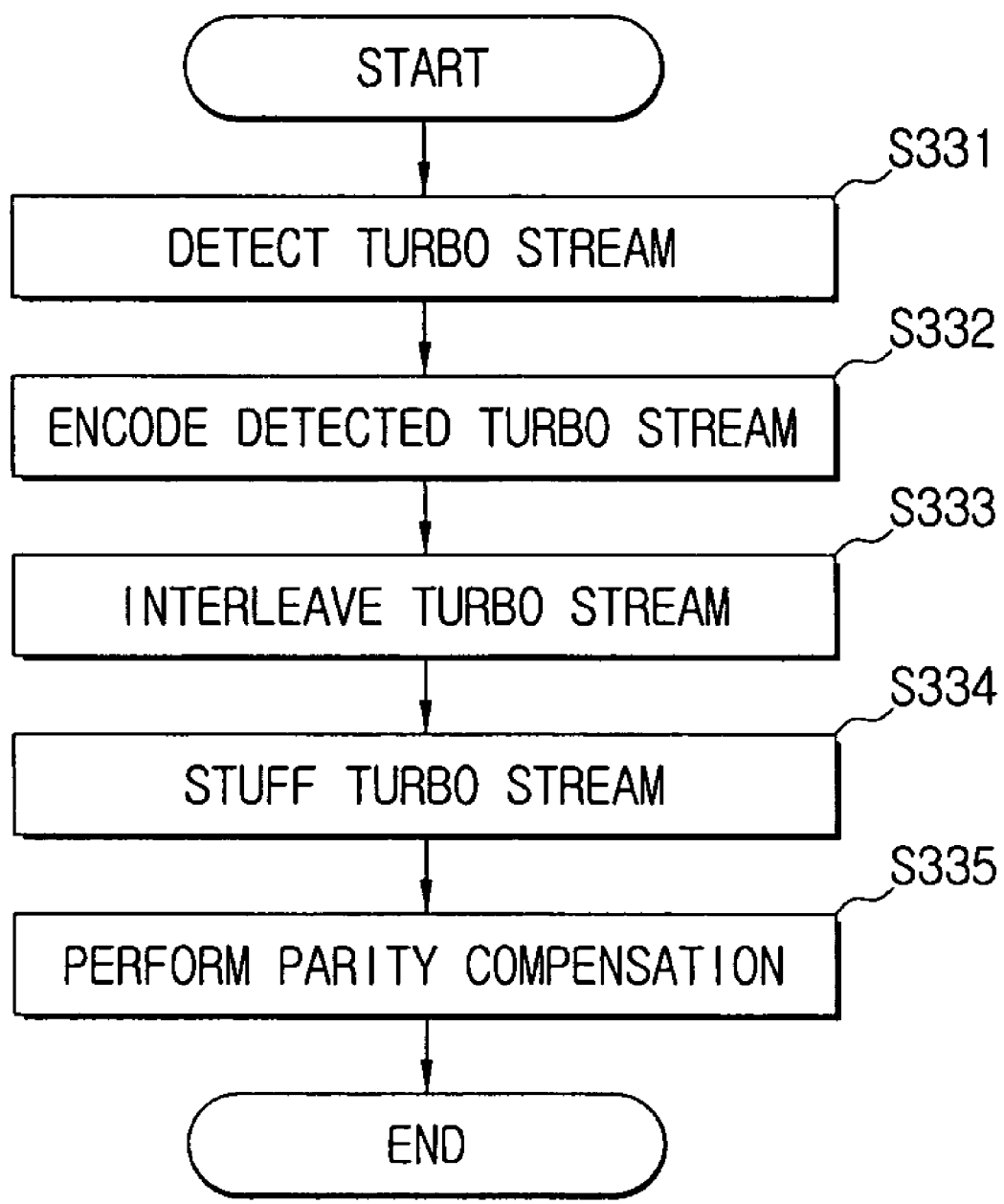
FIG. 10 is a flowchart of an example of the turbo process (the block S330) of FIG. 9 of a method of processing a digital broadcasting signal according to an aspect of the invention.

FIG. 10 is a flowchart of an example of the turbo process (the block S330) of FIG. 9 of a method of processing a digital broadcasting signal according to an aspect of the invention.

Referring to FIG. 10, the turbo stream is detected from the dual transport stream (block S331), and the detected turbo stream is encoded by generating and inserting a parity for the detected turbo stream in a parity insertion region provided in the detected turbo stream (block S332). Before the turbo stream is detected, the dual transport stream can be converted from bytes to symbols using a 12-way symbol interleaving process in accordance with Table D5.2 of ATSC Standard A/53E as described above in connection with FIG. 6.

The encoded turbo stream is interleaved (block S333), and then stuffed back into the dual transport stream to obtain a reconstructed dual transport stream (block S334). This creates a parity error in the reconstructed dual transport due to the change of the turbo stream, and this parity error is compensated for (block S335). Specifically, since a parity is inserted into the detected turbo stream during the encoding of the detected turbo stream (block S332), the parity of the reconstructed dual transport stream becomes different from the parity of the dual transport stream before the turbo process was performed. Accordingly, the parity for the reconstructed dual transport stream is generated and inserted into the dual transport stream to compensate for the difference in parity, i.e., the parity error. If the byte-to-symbol conversion of the dual transport stream before the detection of the turbo stream has been performed as described above, a symbol-to-byte conversion of the parity-compensated dual transport stream is also performed using a 12-way symbol deinterleaving process that is the reverse of the 12-way symbol interleaving process performed in accordance with Table D5.2 of ATSC Standard A/53E as described above in connection with FIG. 6.

Figure 11:
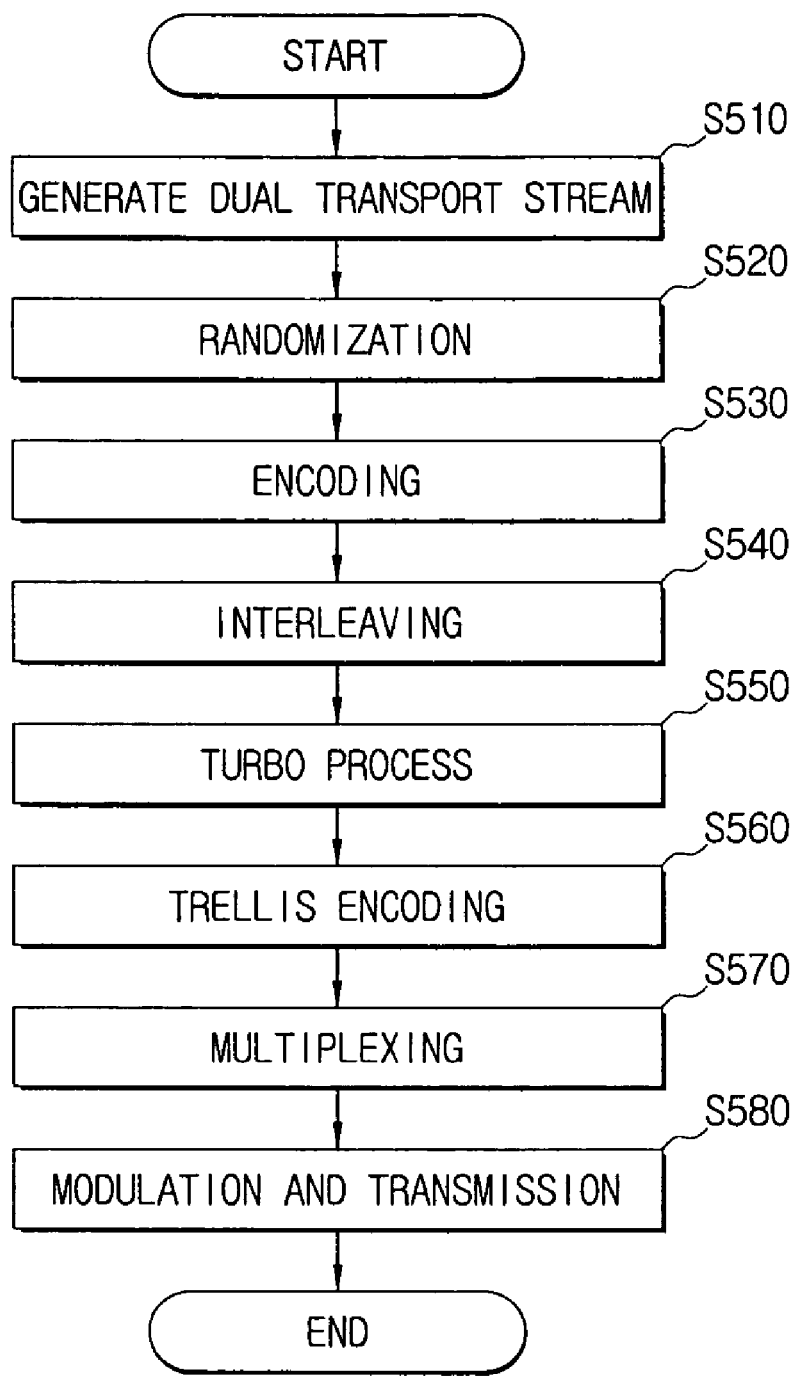
FIG. 11 is a flowchart of an example of a method of processing a digital broadcasting signal according to an aspect of the invention including the portion shown in FIG. 9.

FIG. 11 is a flowchart of an example of a method of processing a digital broadcasting signal according to an aspect of the invention including the portion shown in FIG. 9. Referring to FIG. 11, the dual transport stream including the normal stream and the turbo stream is generated (block S510). The normal stream and the turbo stream can be received from an external module such as a broadcast imaging device, or an internal module such as a compression processing module (e.g., an MPEG-2 module), a video encoder, and an audio encoder. A parity insertion region for inserting a parity during the encoding of the turbo stream is provided in the turbo stream, and then the dual transport stream is generated by multiplexing the turbo stream and the normal stream.

The generated dual transport stream is randomized (block S520). The randomized dual transport stream is encoded (block S530, corresponding to the block S310 of FIG. 9), and then interleaved (block S540, corresponding to the block S540 of FIG. 9). The randomization, encoding, and interleaving processes can be successively performed by a randomizer, an RS encoder, and an interleaver.

A turbo process that robustly processes only the turbo stream of the dual transport stream is performed (block S550, corresponding to the block S330 of FIG. 9). Specifically, the turbo stream is detected from the dual transport stream, and the detected turbo stream is encoded by generating a parity for the turbo stream and inserting the parity into the parity insertion region provided in the turbo stream. After the encoded turbo stream is interleaved, the dual transport stream is reconstructed by stuffing the interleaved turbo stream back into the dual transport stream. Then, the parity error due to the parity inserted in the turbo stream is compensated for.

After the turbo process is completed, the dual transport stream is trellis-encoded (block S560), and a field sync signal and a segment sync signal are multiplexed with the trellis-encoded dual transport stream (block S570). These processes can be performed using a trellis encoder and a multiplexer.

The dual transport stream multiplexed with the sync signals is modulated and then transmitted (block S580). Specifically, a pilot is inserted into the dual transport stream multiplexed with the sync signals by adding a specified DC value to the dual transport stream, and then the dual transport stream with the sync signals and the pilot is equalized to minimize intersymbol interference. The equalized dual transport stream is VSB-modulated, and the VSB-modulated transport stream is modulated to obtain an RF channel band signal that transmits the VSB-modulated transport stream. These processes can be performed using an equalizer, a VSB modulator, and an RF modulator.

As described above, the system for transmitting a digital broadcasting signal and the method thereof according to aspects of the invention can improve the reception performance by performing a turbo process on a turbo stream in a dual transport stream including a normal stream and the turbo stream to improve the reception performance of an ATSC VSB DTV system that is an American-type digital terrestrial broadcasting system. In particular, a system according to an aspect of the invention having a simple construction can improve the reception performance for the turbo stream under diverse receiving conditions compared with the normal stream while maintaining compatibility with the conventional normal stream transmission system.

Although several embodiments of the invention have been shown and described, it would be appreciated by those skilled in the art that changes may be made in these embodiments without departing from the principles and spirit of the invention, the scope of which is defined in the claims and their equivalents.

What is claimed is:

1. A system for transmitting a digital broadcasting signal, comprising:
   a Reed-Solomon encoder that encodes a dual transport stream comprising a normal stream and a turbo stream to obtain an encoded dual transport stream;
   an interleaver that interleaves the encoded dual transport stream to obtain an interleaved dual transport stream; and
   a turbo processor that detects the turbo stream from the interleaved dual transport stream to obtain a detected turbo stream, encodes the detected turbo stream to obtain an encoded turbo stream, stuffs the encoded turbo stream back into the interleaved dual transport stream to obtain a reconstructed dual transport stream, and compensates the reconstructed dual transport stream for a parity error due to the encoded turbo stream to obtain a parity-compensated dual transport stream.

2. The system of claim 1, further comprising a transport stream constructor that receives the normal stream and the turbo stream from a source, multiplexes the normal stream and the turbo stream to obtain the dual transport stream, and outputs the dual transport stream to the Reed-Solomon encoder.

3. The system of claim 2, further comprising a randomizer that receives the dual transport stream output from the transport stream constructor, randomizes the dual transport stream to obtain a randomized dual transport stream, and outputs the randomized dual transport stream to the Reed-Solomon encoder.

4. The system of claim 1, wherein the turbo processor comprises:
   a turbo stream detector that detects the turbo stream from the interleaved dual transport stream to obtain a detected turbo stream;
   an outer encoder that outer-encodes the detected turbo stream by inserting a parity for the detected turbo stream into a parity insertion region of the detected turbo stream to obtain an outer-encoded turbo stream;
   an outer interleaver that outer-interleaves the outer-encoded turbo stream to obtain an outer-interleaved turbo stream;
   a turbo stream stuffer that stuffs the outer-interleaved turbo stream back into the interleaved dual transport stream to obtain the reconstructed dual transport stream; and
   a parity compensator that generates a parity for the reconstructed dual transport stream, and adds the parity for the reconstructed dual transport stream to the reconstructed dual transport stream to obtain the parity-compensated dual transport stream.

5. The system of claim 4, wherein the turbo processor further comprises:
   a byte-to-symbol converter that receives the interleaved dual transport stream from the interleaver, converts the interleaved dual transport stream from bytes to symbols to obtain a symbol-based interleaved dual transport stream, and outputs the symbol-based interleaved dual transport stream to the turbo stream detector; and
   a symbol-to-byte converter that receives the parity-compensated dual transport stream from the parity compensator, converts the parity-compensated dual transport stream from symbols to bytes to obtain a byte-based parity-compensated dual transport stream, and outputs the byte-based parity-compensated dual transport stream.

6. The system of claim 1, further comprising a trellis encoder that trellis-encodes the parity-compensated dual transport stream to obtain a trellis-encoded dual transport stream.

7. The system of claim 6, further comprising a transmitter that transmits the trellis-encoded dual transport stream.

8. The system of claim 7, wherein the transmitter comprises:
   a multiplexer that multiplexes a sync signal with the trellis-encoded dual transport stream to obtain a trellis-encoded dual transport stream with sync;
   a pilot inserter that inserts a pilot into the trellis-encoded dual transport stream with sync to obtain a trellis-encoded dual transport stream with sync and pilot;
   a pre-equalizer that equalizes the trellis-encoded dual transport stream with sync and pilot to obtain an equalized dual transport stream;
   a vestigial sideband (VSB) modulator that performs a VSB modulation of the equalized dual transport stream to obtain a VSB-modulated dual transport stream; and
   a radio-frequency (RF) modulator that performs an RF modulation of the VSB-modulated dual transport stream to obtain an RF channel band signal that transmits the VSB-modulated dual transport stream.

9. The system of claim 1, wherein the dual transport stream comprises a plurality of fields each comprising a plurality of successive packets; and
   wherein the turbo stream is inserted in ones of the packets positioned at predetermined intervals in each of the fields.

10. The system of claim 9, wherein the turbo stream is inserted in one packet out of every four packets in each of the fields; and
    wherein the normal stream is inserted in three packets out of every four packets in each of the fields.

11. The system of claim 1, wherein the encoding of the detected turbo stream performed by the turbo processor is a robust data process that enables the encoded turbo stream of the reconstructed dual transport channel to be transmitted without errors over an inferior channel over which the normal stream of the reconstructed dual transport stream cannot be transmitted without errors.

12. The system of claim 11, wherein the inferior channel is a Doppler fading channel.

13. The system of claim 1, wherein the encoding of the detected turbo stream performed by the turbo processor is a robust data process that enables the encoded turbo stream of the reconstructed dual transport channel to be transmitted with an error rate that is lower than an error rate when the turbo stream of the dual transport channel is transmitted without being subjected to the robust data process.

14. A method of processing a digital broadcasting signal, comprising:
   encoding a dual transport stream comprising a normal stream and a turbo stream to obtain an encoded dual transport stream;
   interleaving the encoded dual transport stream to obtain an interleaved dual transport stream;
   detecting the turbo stream from the interleaved dual transport stream to obtain a detected turbo stream;
   encoding the detected turbo stream to obtain an encoded turbo stream;
   stuffing the encoded turbo stream back into the interleaved dual transport stream to obtain a reconstructed dual transport stream; and
   compensating the reconstructed dual transport stream for a parity error due to the encoded turbo stream to obtain a parity-compensated dual transport stream.

15. The method of claim 14, further comprising receiving the normal stream and the turbo stream from a source; and
   multiplexing the normal stream and the turbo stream to obtain the dual transport stream.

16. The method of claim 14, further comprising randomizing the dual transport stream to obtain a randomized dual transport stream;
   wherein the encoding of the dual transport stream comprises encoding the randomized dual transport stream to obtain the encoded dual transport stream.

17. The method of claim 14, wherein the encoding of the detected turbo stream comprises:
   outer-encoding the detected turbo stream by inserting a parity for the detected turbo stream into a parity insertion region of the detected turbo stream to obtain an outer-encoded turbo stream; and
   outer-interleaving the outer-encoded turbo stream to obtain an outer-interleaved turbo stream;
   wherein the stuffing of the encoded turbo stream comprises stuffing the outer-interleaved turbo stream back into the interleaved dual transport stream to obtain the reconstructed dual transport stream; and
   wherein the compensating of the reconstructed dual transport stream comprises:
      generating a parity for the reconstructed dual transport stream; and
      adding the parity for the reconstructed dual transport stream to the reconstructed dual transport stream to obtain the parity-compensated dual transport stream.

18. The method of claim 17, further comprising converting the interleaved dual transport stream from bytes to symbols to obtain a symbol-based interleaved dual transport stream;
   wherein the detecting of the turbo stream comprises detecting the turbo stream from the symbol-based interleaved dual transport stream to obtain the detected turbo stream; and
   wherein the method further comprises converting the parity-compensated dual transport stream from bytes to symbols to obtain a byte-based parity-compensated dual transport stream.

19. The method of claim 14, further comprising:
   trellis-encoding the parity-compensated dual transport stream to obtain a trellis-encoded dual transport stream; and
   transmitting the trellis-encoded dual transport stream.

20. The method of claim 19, wherein the transmitting of the trellis-encoded dual transport stream comprises:
   multiplexing a sync signal with the trellis-encoded dual transport stream to obtain a trellis-encoded dual transport stream with sync;
   inserting a pilot into the trellis-encoded dual transport stream with sync to obtain a trellis-encoded dual transport stream with sync and pilot;
   equalizing the trellis-encoded dual transport stream with sync and pilot to obtain an equalized dual transport stream;
   performing a vestigial sideband (VSB) modulation of the equalized dual transport stream to obtain a VSB-modulated dual transport stream; and
   performing a radio-frequency (RF) modulation of the VSB-modulated dual transport stream to obtain an RF channel band signal that transmits the VSB-modulated dual transport stream.

21. The method of claim 14, wherein the dual transport stream comprises a plurality of fields each comprising a plurality of successive packets; and
   wherein the turbo stream is inserted in ones of the packets positioned at predetermined intervals in each of the fields.

22. The method of claim 21, wherein the turbo stream is inserted in one packet out of every four packets in each of the fields; and
   wherein the normal stream is inserted in three packets out of every four packets in each of the fields.

23. The method of claim 14, wherein the encoding of the detected turbo stream is a robust data process that enables the encoded turbo stream of the reconstructed dual transport channel to be transmitted without errors over an inferior channel over which the normal stream of the reconstructed dual transport stream cannot be transmitted without errors.

24. The method of claim 23, wherein the inferior channel is a Doppler fading channel.

25. The method of claim 14, wherein the encoding of the detected turbo stream is a robust data process that enables the encoded turbo stream of the reconstructed dual transport channel to be transmitted with an error rate that is lower than an error rate when the turbo stream of the dual transport channel is transmitted without being subjected to the robust process.

* * * * *